US009596792B2

(12) United States Patent
Son et al.

(10) Patent No.: US 9,596,792 B2
(45) Date of Patent: Mar. 14, 2017

(54) DISPLAY APPARATUS (71) Applicant: Samsung Display Co., Ltd., Yongin, Gyeonggi-Do (KR)

(72) Inventors: Jung-Hyun Son, Yongin (KR); Kie Hyun Nam, Yongin (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 368 days.

(21) Appl. No.: 14/059,674

(22) Filed: Oct. 22, 2013

(65) Prior Publication Data
US 2015/0009628 A1 Jan. 8, 2015

(30) Foreign Application Priority Data
Jul. 2, 2013 (KR) .................. 10-2013-0077371

(51) Int. Cl.
*H05K 7/20* (2006.01)
*H01L 51/52* (2006.01)

(52) U.S. Cl.
CPC ....... *H05K 7/20954* (2013.01); *H01L 51/529* (2013.01); *H01L 51/5246* (2013.01)

(58) Field of Classification Search
CPC . H01L 51/524; H01L 51/5253; H01L 51/525; H01L 51/5246; H04N 1/00132; H04N 1/00233; H04N 1/00283; G02F 2001/133314; G02F 2201/503
USPC ............... 257/40, E51.001, E51.18; 438/26; 361/679.24, 707, 725, 749
See application file for complete search history.

(56) References Cited

U.S. PATENT DOCUMENTS

| | | | | |
|---|---|---|---|---|
| 7,468,582 B2* | 12/2008 | Kim | ................... | H05K 7/20963 313/46 |
| 7,602,110 B2* | 10/2009 | Jeong | ....................... | H01J 11/12 313/46 |
| 7,888,870 B2* | 2/2011 | Hasegawa | ................ | C03C 8/24 313/586 |
| 8,125,146 B2* | 2/2012 | Park | ......................... | C03C 8/02 313/512 |
| 8,313,806 B2* | 11/2012 | Matsuura | .............. | C23C 14/042 427/248.1 |
| 8,531,103 B2* | 9/2013 | Iwasaki | ................. | H01L 27/322 313/489 |
| 8,698,131 B2* | 4/2014 | Gyoda | ............... | H01L 51/5237 257/40 |
| 8,710,492 B2* | 4/2014 | Niboshi et al. | ................. | 257/40 |
| 2005/0269944 A1* | 12/2005 | Su | ...................... | H01L 51/5237 313/504 |

(Continued)

FOREIGN PATENT DOCUMENTS

| | | | |
|---|---|---|---|
| JP | 2008-251450 A | 10/2008 | |
| JP | 2009-071333 A | 4/2009 | |

(Continued)

*Primary Examiner* — Courtney Smith
*Assistant Examiner* — Matt Dhillon
(74) *Attorney, Agent, or Firm* — Cantor Colburn LLP (57) ABSTRACT

A display apparatus includes: a substrate; a display panel on the substrate; and a sealing substrate opposite to the display panel. The display apparatus includes further includes a heat dissipating layer which is between the display panel and the sealing substrate and dissipates heat generated from the display panel; and a sealing portion which is between the substrate and the sealing substrate and surrounds the display panel.

12 Claims, 8 Drawing Sheets

(56) References Cited

U.S. PATENT DOCUMENTS

| | | | |
|---|---|---|---|
| 2007/0170839 A1* | 7/2007 | Choi | C03C 8/24 313/500 |
| 2007/0172971 A1* | 7/2007 | Boroson | H01L 51/5246 438/26 |
| 2009/0029623 A1* | 1/2009 | Son | H01L 51/5237 445/25 |
| 2011/0211134 A1* | 9/2011 | Yoshikawa | G02F 1/133615 348/739 |
| 2012/0080671 A1* | 4/2012 | Niboshi | H01L 51/524 257/40 |
| 2012/0319092 A1* | 12/2012 | Shimomura | B32B 37/06 257/40 |
| 2013/0048967 A1* | 2/2013 | Nishido | H05B 33/04 257/40 |
| 2015/0171362 A1* | 6/2015 | Sato | H01L 51/5203 257/40 |
| 2015/0185142 A1* | 7/2015 | Zeng | G01N 21/3554 257/40 |

FOREIGN PATENT DOCUMENTS

| | | |
|---|---|---|
| JP | 2010-080307 A | 4/2010 |
| KR | 1020120089471 A | 8/2012 |

\* cited by examiner

DISPLAY APPARATUS

This application claims priority to Korean Patent Application No. 10-2013-0077371 filed on Jul. 2, 2013, and all the benefits accruing therefrom under 35 U.S.C. §119, the entire contents of which are incorporated herein by reference.

BACKGROUND (a) Field

The disclosure relates to a display apparatus.

(b) Description of the Related Art

As popular display apparatuses, there is a liquid crystal display ("LCD"), a plasma display panel ("PDP"), an organic light emitting display ("OLED"), a field effect display ("FED"), and an electrophoretic display ("EPD").

Particularly, the OLED display includes two electrodes, and an organic emission layer disposed therebetween. Electrons from one electrode and holes from the other electrode are combined in the organic emission layer to thereby generate excitons, which release energy to emit light.

SUMMARY

The invention provides a display apparatus including a display panel such as an organic light emitting diode ("OLED") display, having advantages of reducing or effectively preventing deterioration of an organic emission layer of the OLED display, by efficiently dissipating heat generated in the OLED display to the outside of the display apparatus.

An exemplary embodiment of the invention provides a display apparatus including: a substrate; a display panel on the substrate; a sealing substrate opposite to the display panel; a heat dissipating layer which is between the display panel and the sealing substrate and is configured to dissipate heat generated from the display panel; and a sealing portion which is between the substrate and the sealing substrate and surrounds the display panel.

The display apparatus may further include a first adhesion layer which is between the heat dissipating layer and the display panel and couples the heat dissipating layer and the display panel to each other.

The display apparatus may further include a second adhesion layer which is between the heat dissipating layer and the sealing substrate and couples the heat dissipating layer and the sealing substrate to each other.

Each of the first and second adhesion layers may include one of epoxy, acrylate and silicone.

The heat dissipating layer may include a thermally conductive material.

The thermally conductive material may include one of graphite, alumina, silver, copper and aluminum, and a combination thereof.

The sealing substrate may include one of glass, metal and plastic.

The display apparatus may further include a getter layer which is between the display panel and the sealing portion and surrounds the display panel.

One or more exemplary embodiment of the display apparatus in accordance with the invention can dissipate the heat generated in OLED display as the display panel to thereby reduce or effectively prevent deterioration of the organic emission layer, by the heat dissipating layer between the sealing substrate and the display panel.

BRIEF DESCRIPTION OF THE DRAWINGS

The above and other features of this disclosure will become more apparent by describing in further detail exemplary embodiments thereof with reference to the accompanying drawings, in which.

DETAILED DESCRIPTION

The invention will be described more fully hereinafter with reference to the accompanying drawings, in which exemplary embodiments of the invention are shown. As those skilled in the art would realize, the described embodiments may be modified in various different ways, all without departing from the spirit or scope of the invention. In the drawings and this specification, parts or elements that are not related to the description hereof are omitted in order to clearly describe the invention, and the same or like elements are designated by the same reference numerals throughout the specification.

In addition, the size and thickness of each component shown in the drawings are arbitrarily shown for better understanding and ease of description, but the invention is not limited thereto.

In the drawings, the thickness of layers, films, panels, regions, etc., are exaggerated for clarity. In the drawings, for better understanding and ease of description, the thickness of some layers and areas is exaggerated. Throughout this specification, when a first part of a layer, a film, a plate, or the like is described as being arranged "on" a second part, this indicates the first part is arranged on the second part directly or with a third part therebetween.

The terminology used herein is for the purpose of describing particular embodiments only and is not intended to be limiting of the invention. As used herein, the singular forms "a," "an" and "the" are intended to include the plural forms as well, unless the context clearly indicates otherwise. Further, throughout this specification, when a part is described as "comprising (or including)" elements, this indicates that the part may further include other elements unless particularly otherwise defined. As used herein, the term "and/or" includes any and all combinations of one or more of the associated listed items.

Furthermore, when the first part is described as being arranged "on" the second part, this indicates that the first part is arranged at an upper side or a lower side of the second part without the limitation to the upper side thereof on the basis of the gravity direction.

Embodiments of the invention are described herein with reference to cross-section illustrations that are schematic illustrations of idealized embodiments (and intermediate structures) of the invention. As such, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

All methods described herein can be performed in a suitable order unless otherwise indicated herein or otherwise clearly contradicted by context. The use of any and all examples, or exemplary language (e.g., "such as"), is intended merely to better illustrate the invention and does not pose a limitation on the scope of the invention unless otherwise claimed. No language in the specification should be construed as indicating any non-claimed element as essential to the practice of the invention as used herein.

An inner temperature of a display apparatus including a display panel such as an organic light emitting diode ("OLED") display is increased by the heat generated from driving of the OLED. As the inner temperature of the display apparatus is increased, an inner layer of the display panel such as an organic emission layer of the OLED which is vulnerable to heat may be deteriorated. Once the organic emission layer is deteriorated, the life-span of the OLED, the OLED display and/or the display apparatus including the OLED display is reduced and image quality thereof is deteriorated.

In order to prevent such problems, in the display apparatus, a heat dissipation sheet is generally attached to an upper portion of a sealing substrate by using a double-sided adhesive tape or the like to thereby dissipate the heat from the display panel such as the OLED display. This, however, causes the overall thickness of the display apparatus and/or the OLED display to be undesirably increased and/or makes efficiently dissipating the heat between the sealing substrate and the OLED display to the outside difficult due to the double-sided adhesive tape or the like. Therefore, there remains a need for an improved display apparatus and/or display panel having a reduced thickness and which has improved heat dissipation.

Hereinafter, the invention will be described in detail with reference to the accompanying drawings.

Figure 1:
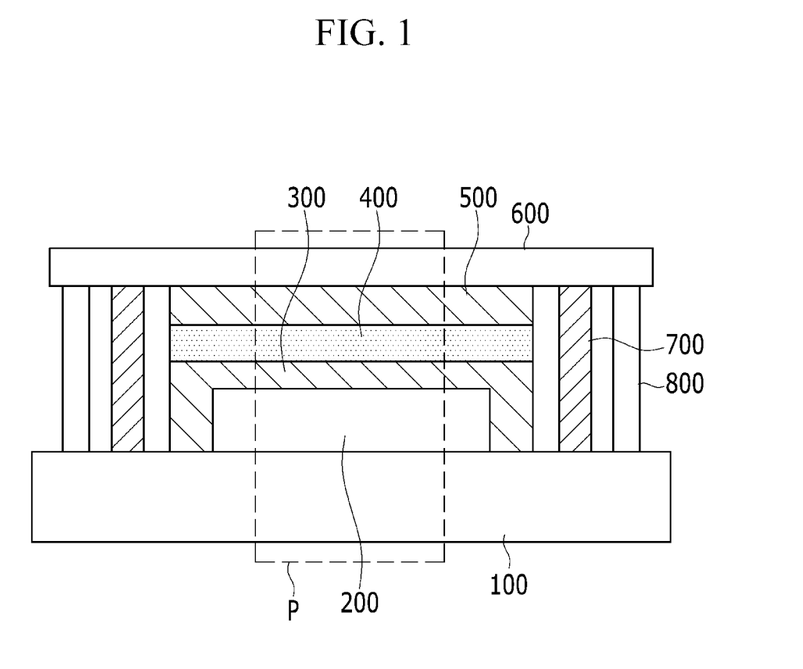
FIG. 1 is a cross-sectional view of an exemplary embodiment of a display apparatus in accordance with the invention.

Referring to FIG. 1, in an exemplary embodiment of a display apparatus in accordance with the invention, a heat dissipating layer 400 can be disposed between a sealing substrate 600 and a display panel 200 to thereby efficiently dissipate heat generated from the display panel 200 to the outside of the display apparatus.

The display apparatus in accordance with the illustrated exemplary embodiment may include a substrate 100, the display panel 200, the heat dissipating layer 400, the sealing substrate 600 and a sealing portion 800.

Referring to FIG. 1, the substrate 100 corresponds to a base layer on which a display panel and the like are disposed in a general display apparatus.

The substrate 100 may be an insulating substrate including glass, quartz, ceramic, plastic, or the like, but is not limited thereto. In one exemplary embodiment, for example, the substrate 100 may be a metal substrate including stainless steel or the like.

In accordance with the illustrated exemplary embodiment, the display panel 200 can display an image. In the illustrated exemplary embodiment, the display panel 200 includes a light emitting layer such as an organic emission layer, which will be described in detail later.

In the illustrated exemplary embodiment, the light emitting layer of the display panel 200 includes the organic emission layer employed in an OLED display. However, the display apparatus in accordance with the illustrated exemplary embodiment may be applied to a liquid crystal display ("LCD"), a field effect display ("FED"), and an electrophoretic display ("EPD") without being limited to the OLED display.

The sealing substrate 600 is disposed on the display panel 200 to seal display panel 200. The sealing substrate 600 serves to protect the display panel 200 from external moisture or oxygen. Particularly, the sealing substrate 600 may reduce or effectively prevent deterioration of the light emitting layer, such as the organic emission layer, of the display panel 200 from by moisture or oxygen.

The sealing substrate 600 may include various materials, such as one of a glass material, a metal material and a plastic material.

Referring to FIG. 1, the sealing portion 800 is disposed between the sealing substrate 600 and the substrate 100. In addition, the sealing portion 800 is disposed around the display panel 200 to surround the display panel 200, such as in a plan view of the display apparatus.

Where the sealing portion 800 is disposed between the sealing substrate 600 and the substrate 100, the sealing portion 800 is coupled to the sealing substrate 600 and the substrate 100. The sealing portion 800 may include a material including frit. However, the sealing portion 800 may include any of a number of various materials by which the sealing substrate 600 and the substrate 100 are coupled to each other without being limited thereto.

In accordance with the illustrated exemplary embodiment, the heat dissipating layer 400 is disposed between the sealing substrate 600 and the display panel 200. The heat dissipating layer 400 is configured to dissipate the heat generated in the display panel 200 to the outside the display panel 200 and/or the display apparatus.

Particularly, the OLED display including an organic emission layer may be deteriorated by moisture or heat. Accordingly, where dissipating the heat generated in the display panel 200 including an organic emission layer to the outside is difficult, the temperature of the display panel 200 is increased so that the organic emission layer and/or the display panel 200, may be deteriorated.

In accordance with the illustrated exemplary embodiment, the heat dissipating layer 400 is disposed between the sealing substrate 600 and the display panel 200 in order to reduce or effectively prevent deterioration of the display panel 200.

The heat dissipating layer 400 may include a thermally conductive material. Where the heat dissipating layer 400 includes the thermally conductive material, rapid dissipation of the heat generated in the display panel 200 to the outside is possible.

A thermally conductive material of the heat dissipating layer 400 may include one of graphite, alumina, silver, copper and aluminum. In other words, the heat dissipating layer 400 may include one of the aforementioned materials or a combination of two or more of the aforementioned materials.

In an exemplary embodiment of manufacturing a display apparatus, the heat dissipating layer 400 may be formed by processing a material in a discrete bead or discrete pellet pattern.

Further, the heat dissipating layer 400 is located over the display panel 200 to cover the display panel 200. The heat dissipating layer 400 may be disposed to cover a whole of the display panel 200 in order for the heat dissipating layer 400 to efficiently dissipate the heat generated in the display panel 200. The heat dissipating layer 400 may overlap an entire of the display panel 200 in the plan view. However, the heat dissipating layer 400 may be disposed to cover a part of a top surface of the display panel 200 such that a portion of the display panel 200 is exposed by the heat dissipating layer 400, without being limited thereto.

In accordance with the illustrated exemplary embodiment, a first adhesion layer 300 may be included between the display panel 200 and the heat dissipating layer 400 such that the heat dissipating layer 400 is adhered to the display panel 200 via the first adhesion layer 300.

Where the adhesion layer 300 may be included between the display panel 200 and the heat dissipating layer 400, the first adhesion layer 300 can efficiently transfer the heat generated in the display panel 200 to the heat dissipating layer 400 by adhering the heat dissipating layer 400 to the top surface of the display panel 200.

Further, the first adhesion layer 300 includes a material through which the heat dissipating layer 400 and the display panel 200 are coupled to each other. In one exemplary embodiment, for example, the first adhesion layer 300 may include one of epoxy, acrylate and silicone, and a combination thereof.

The first adhesion layer 300 may be attached to the top surface of the display panel 200 in a film pattern, that is, as a substantially flat and uniform thickness member which may be separately provided and subsequently attached to the display panel 200. Alternatively, in an exemplary embodiment of manufacturing a display apparatus, the first adhesion layer 300 may be formed by coating a liquid material on the top surface of the first adhesion layer 300. The first adhesion layer 300 may also be formed by coating the liquid material and then hardening the liquid material with a heat curing method or an ultraviolet ("UV") curing method.

In addition, a second adhesion layer 500 may be disposed between the heat dissipating layer 400 and the sealing substrate 600. The second adhesion layer 500 facilitates coupling between the heat dissipating layer 400 and the sealing substrate 600.

As the heat dissipating layer 400 and the sealing substrate 600 are adhered to each other by the second adhesion layer 500, the heat generated in the display panel 200 can be easily dissipated to the outside of the sealing substrate 600 via the heat dissipating layer 400.

The second adhesion layer 500 may include one of epoxy, acrylate and silicone, and a combination thereof, similarly to the first adhesion layer 300.

The second adhesion layer 500 may also be disposed on the top surface of the heat dissipating layer 400 in the film pattern or by such a liquid coating method, similarly to the first adhesion layer 300.

Further, referring to FIG. 1, an absorption layer 700, which may be otherwise referred to as a getter layer may be disposed between the display panel 200 and the sealing portion 800, in the plan view. The getter layer 700 is disposed to surround the display panel 200, similarly to the sealing portion 800.

The getter layer 700 can remove moisture or oxygen absorbed into the display panel 200. The getter layer 700 may include a material which can absorb moisture or oxygen. In one exemplary embodiment, for example, the getter layer 700 may include one of barium oxide, calcium oxide, magnesium oxide, lithium oxide, sodium oxide, potassium oxide, lithium sulfate, sodium sulfate, calcium sulfate, magnesium sulfate, potassium sulfate, potassium chlorate, magnesium chloride, calcium bromide, cesium bromide, vanadium bromide and calcium nitride, and a combination thereof.

Hereinafter, an exemplary embodiment of a manufacturing process of a display apparatus in accordance with the invention will be described in brief with reference to FIG. 2 to FIG. 7.

Figure 2:
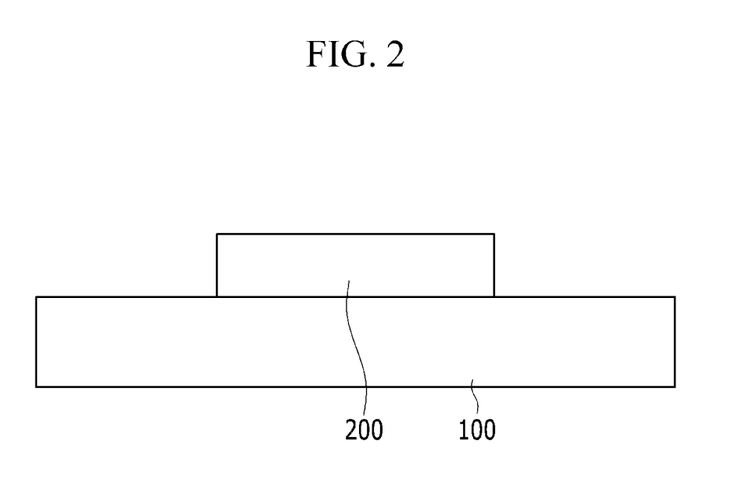
FIG. 2 to FIG. 7 show an exemplary embodiment of a manufacturing process of a display apparatus in accordance with the invention.

First, the display panel 200 is formed (e.g., provided) on the substrate (see FIG. 2). Herein, the display panel 200 is briefly shown in FIG. 2, but the display panel 200 may include a plurality of layers as will be described later.

Figure 3:
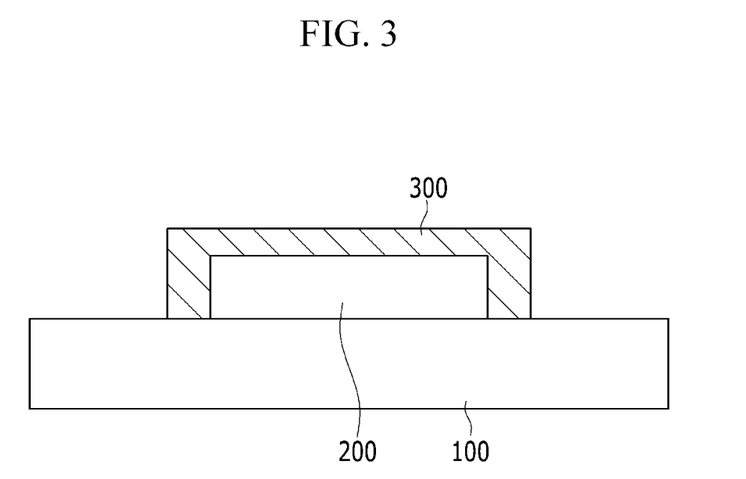

The first adhesion layer 300 is formed on the top surface of the display panel 200. The first adhesion layer 300 may be formed to cover not only the top surface of the display panel 200 but also side surfaces thereof. As described above, the first adhesion layer 300 may be formed on the top surface of the display panel 200 in the film pattern or with the liquid coating method.

Figure 4:
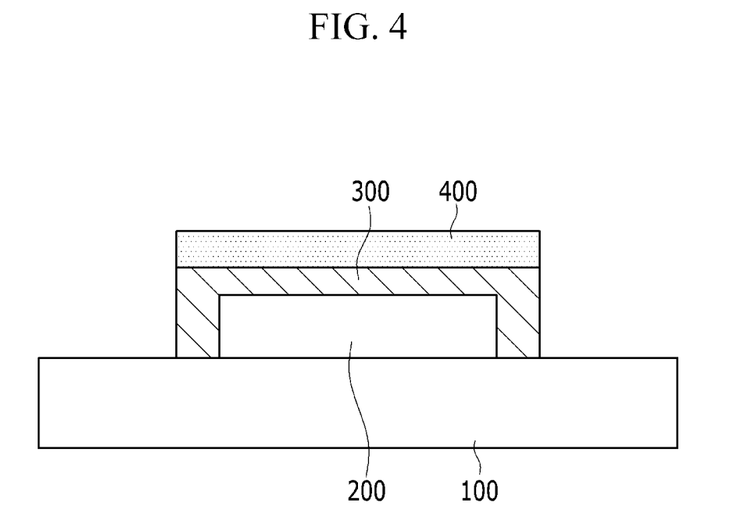

Successively, the heat dissipating layer 400 may be formed on the top surface of the display panel 200 (see FIG. 4). As described above, the heat generated in the display panel 200 can be transferred to the heat dissipating layer 400 by attaching the heat dissipating layer 400 to the top surface of the display panel 200. The heat dissipating layer 400 may be formed on the top surface of the display panel 200, but also may be formed to cover not only the top surface of the display panel 200 but also side surfaces thereof.

In FIG. 4, a cross-sectional thickness of the first adhesion layer 300 is shown to be similar to that of the heat dissipating layer 400. However, the cross-sectional thickness of the first adhesion layer 300 may be smaller than that of the heat dissipating layer 400. A cross-sectional thickness of the first adhesion layer 300 is sufficient if the first adhesion layer 300 adheres and secures the heat dissipating layer 400 to the top surface of the display panel 200.

Figure 5:
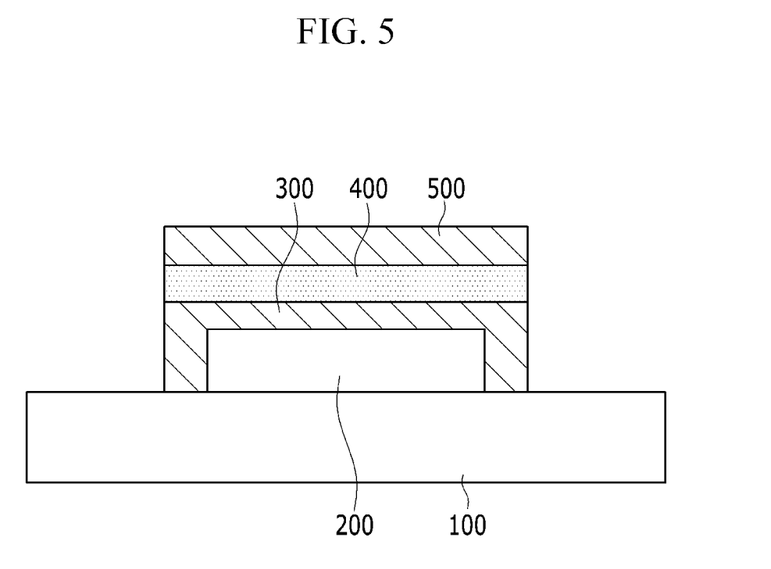

Referring to FIG. 5, the second adhesion layer 500 may be formed on the top surface of the heat dissipating layer 400. As described above, the second adhesion layer 500 is formed in order to couple the heat dissipating layer 400 and the sealing substrate 600 to each other. Similarly to the first adhesion layer 300, the second adhesion layer 500 may be formed on the top surface of the heat dissipating layer 400 in the film pattern or with the liquid coating method.

Figure 6:
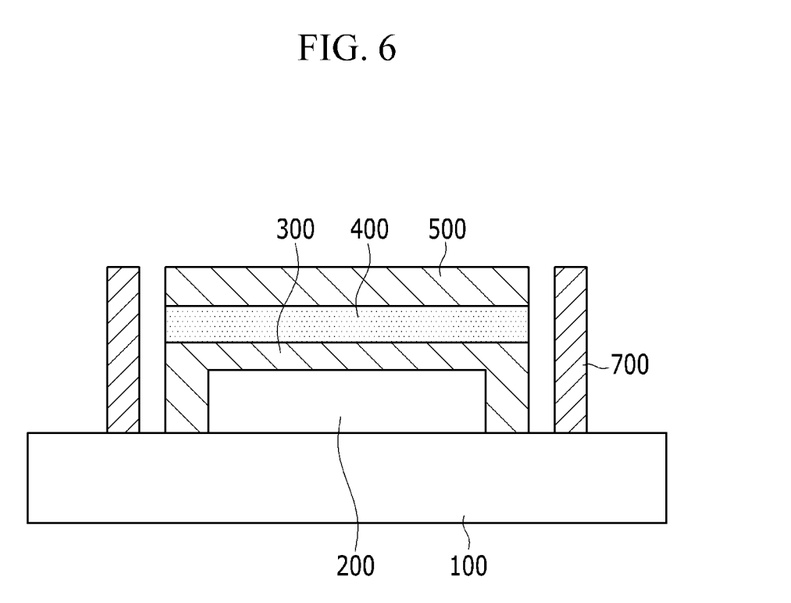
Figure 7:
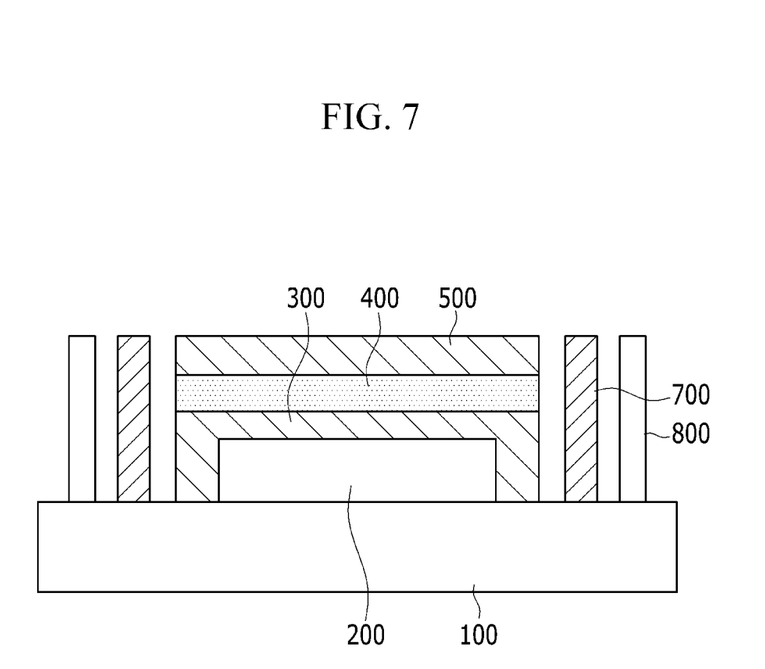

The getter layer 700 and the sealing portion 800 are sequentially formed to surround the display panel 200 (see FIG. 6 and FIG. 7). The getter layer 700 and the sealing portion 800 may be formed at a circumference of the display panel 200 by using a mask.

Referring again to FIG. 1, after the getter layer 700 and sealing portion 800 are formed, the sealing substrate 600 is located over the getter layer 700, the sealing portion 800 and the second adhesion layer 500 to complete the sealing of the display panel 200 by the sealing substrate 600.

Figure 8:
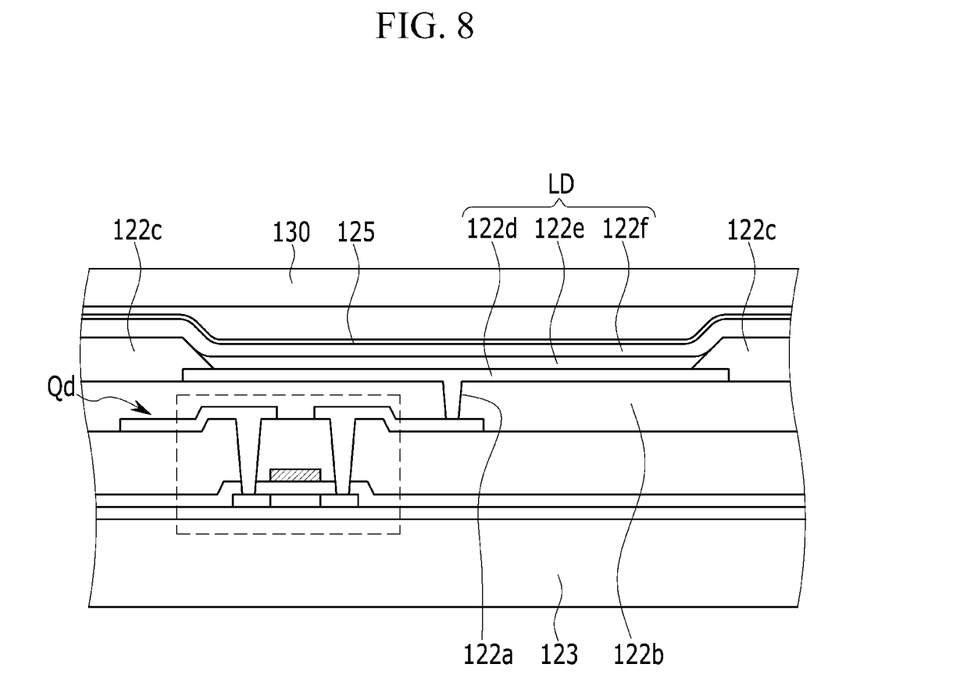
FIG. 8 is an enlarged view of an exemplary embodiment of a region P shown in FIG. 1.

FIG. 8 is an enlarged and detailed cross-sectional view of an exemplary embodiment of a region P shown in FIG. 1.

With reference to FIG. 8, a display apparatus, particularly including an OLED display, in accordance with the invention will be described in detail.

Referring to FIG. 8, a driving transistor Qd may be disposed above a display substrate 123 which may include transparent glass, plastic, or the like. Here, the display substrate 123 corresponds to the substrate 100 of FIG. 1.

A protective layer 122b is disposed on the driving transistor Qd. The protective layer 122b may include an inorganic material or an organic material. Where the protective layer 122b includes the organic material, a surface such as an upper surface thereof may be flat.

A via hole 122a may be defined in the protective layer 122b to expose a portion of the driving transistor Qd.

In addition, a first electrode 122d is disposed on the protective layer 122b. The first electrode 122d may collectively include a reflective electrode, and a transparent electrode disposed on the reflective electrode. The reflective electrode may include metal having high reflectivity, such as silver (Ag) or aluminum (Al), or an alloy thereof. The transparent electrode may include a transparent conductive oxide, such as indium tin oxide ("ITO") or indium zinc oxide ("IZO").

A pixel defining layer 122c is disposed on the protective layer 122b while covering the periphery of the outer edge of the first electrode 122d.

Referring to FIG. 8, an organic emission layer 122e is disposed on the first electrode 122d. In addition, a second electrode 122f is disposed on the organic emission layer 122e and the pixel defining layer 122c. The first electrode 122d, the organic emission layer 122d and the second electrode 122f may collectively form a light emitting element LD.

The organic emission layer 122e may include a light emission layer (not shown) in which light emission actually occurs, and may further include organic layers (not shown) for effectively transferring carriers, such as holes or electrodes, to the light emission layer. The organic layers may include, but are not limited to, a hole injection layer and a hole transfer layer, which are disposed between the first electrode 122d and the light emission layer, and an electron injection layer and an electron transfer layer, which are disposed between the second electrode 122f and the light emission layer.

Further, a capping layer 125 may be disposed on the second electrode 122f to cover and protect the second electrode 122f, and the capping layer 125 may include an organic layer.

In accordance with the illustrated exemplary embodiment, a sealing substrate 130 may be spaced apart from the capping layer 125 in a cross-sectional direction, but the invention is not limited thereto. Here, the sealing substrate 130 shown in FIG. 8 corresponds to the sealing substrate 600 shown in FIG. 1.

In an exemplary embodiment, referring to FIG. 1 and FIG. 8, the second adhesion layer 500, the heat dissipating layer 400 and the first adhesion layer 300 may be sequentially stacked between the capping layer 125 and the sealing substrate 130.

One or more exemplary embodiment of a display apparatus in accordance with the invention can dissipate the heat generated in the display panel thereof, to thereby reduce or effectively prevent deterioration of a light emitting layer such as including the organic emission layer of an OLED display, by disposing the heat dissipating layer between the sealing substrate and the display panel.

While this invention has been described in connection with what is presently considered to be practical exemplary embodiments, it is to be understood that the invention is not limited to the disclosed exemplary embodiments, but, on the contrary, is intended to cover various modifications and equivalent arrangements included within the spirit and scope of the appended claims.

What is claimed is:
1. A display apparatus comprising:
   a substrate;
   a display panel on the substrate;
   a sealing substrate opposite to the display panel;
   a heat dissipating layer between the display panel and the sealing substrate, wherein the heat dissipating layer overlaps an entirety of the display panel in the plan view to dissipate heat generated from the display panel;
   a sealing portion between the substrate and the sealing substrate, and surrounding the display panel;
   a first adhesion layer between the heat dissipating layer and the display panel, wherein the first adhesion layer couples the heat dissipating layer and the display panel to each other; and
   a second adhesion layer between the heat dissipating layer and the sealing substrate, wherein the second adhesion layer couples the heat dissipating layer and the sealing substrate to each other.

2. The display apparatus of claim 1, wherein each of the first and second adhesion layers comprises one of epoxy, acrylate and silicone, and a combination thereof.

3. The display apparatus of claim 1, wherein the heat dissipating layer comprises a thermally conductive material.

4. The display apparatus of claim 3, wherein the thermally conductive material comprises one of graphite, alumina, silver, copper and aluminum, and a combination thereof.

5. The display apparatus of claim 1, wherein the sealing substrate comprises one of glass, metal and plastic.

6. The display apparatus of claim 1, further comprising a getter layer between the display panel and the sealing portion, and surrounding the display panel.

7. The display apparatus of claim 1, wherein the display panel is an organic light emitting display.

8. A method of manufacturing a display apparatus, comprising:
   providing a display panel on a substrate;
   disposing a sealing substrate opposite to the display panel;
   disposing a heat dissipating layer between the display panel and the sealing substrate, wherein the heat dissipating layer overlaps an entirety of the display panel in the plan view to dissipate heat generated from the display panel; and
   disposing a sealing portion between the substrate and the sealing substrate, to surround the display panel and seal the display panel between the substrate and the sealing substrate,
   wherein the disposing the heat dissipating layer between the display panel and the sealing substrate comprises forming a first adhesion layer on the display panel to couple the heat dissipating layer to the display panel; and
   wherein the disposing the heat dissipating layer between the display panel and the sealing substrate further comprises forming a second adhesion layer on the heat dissipating layer to couple the heat dissipating layer to the sealing substrate.

9. The method of claim 8, wherein the forming the first adhesion layer on the display panel comprises forming the first adhesion layer on an upper surface and a side surface of the display panel.

10. The method of claim 8, wherein the disposing the heat dissipating layer between the display panel and the sealing substrate comprises disposing the heat dissipating layer to overlap a whole of the display panel.

11. The display apparatus of claim 1, wherein
   the substrate extends further than outer edges of the display panel, and
   the sealing portion is between the sealing substrate and the substrate which extends further than the outer edges of the display panel to couple the sealing substrate and the substrate to each other.

12. The method of claim 8, wherein
the substrate extends further than outer edges of the display panel, and
the sealing portion is between the sealing substrate and the substrate which extends further than the outer edges of the display panel to couple the sealing substrate and the substrate to each other.

\* \* \* \* \*